US009437609B2

(12) United States Patent
Huo et al.

(10) Patent No.: US 9,437,609 B2
(45) Date of Patent: Sep. 6, 2016

(54) VERTICAL CHANNEL-TYPE 3D SEMICONDUCTOR MEMORY DEVICE AND METHOD FOR MANUFACTURING THE SAME

(71) Applicant: INSTITUTE OF MICROELECTRONICS, CHINESE ACADEMY OF SCIENCES, Beijing (CN)

(72) Inventors: Zongliang Huo, Beijing (CN); Ming Liu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/581,990

(22) Filed: Dec. 23, 2014

(65) Prior Publication Data
US 2015/0179661 A1   Jun. 25, 2015

Related U.S. Application Data

(63) Continuation of application No. PCT/CN2012/086511, filed on Dec. 13, 2012.

(51) Int. Cl.
| | |
|---|---|
| H01L 29/792 | (2006.01) |
| H01L 27/115 | (2006.01) |
| H01L 21/764 | (2006.01) |
| H01L 29/788 | (2006.01) |
| H01L 21/02 | (2006.01) |

(Continued)

(52) U.S. Cl.
CPC ..... *H01L 27/11582* (2013.01); *H01L 21/0217* (2013.01); *H01L 21/02181* (2013.01);

(Continued)

(58) Field of Classification Search
CPC ................. H01L 27/11524; H01L 27/11529; H01L 27/1157; H01L 29/7883; H01L 21/02592; H01L 21/02532; H01L 27/11582
USPC ......... 257/319, 324, 774; 438/261, 478, 675
See application file for complete search history.

(56) References Cited

U.S. PATENT DOCUMENTS

| | | |
|---|---|---|
| 8,441,059 B2 | 5/2013 | Sim et al. |
| 8,895,393 B2 | 11/2014 | Sim et al. |

(Continued)

FOREIGN PATENT DOCUMENTS

| | | |
|---|---|---|
| CN | 101651144 A | 2/2010 |
| CN | 102315173 A | 1/2012 |

OTHER PUBLICATIONS

International Search Report dated Jul. 18, 2013, issued in International Application No. PCT/CN2012/086511, filed Dec. 13, 2012.

(Continued)

*Primary Examiner* — Jarrett Stark
*Assistant Examiner* — Shahed Ahmed
(74) *Attorney, Agent, or Firm* — Knobbe, Martens, Olson & Bear, LLP

(57) ABSTRACT

A vertical channel-type 3D semiconductor memory device and a method for manufacturing the same are disclosed. In one aspect, the device includes a multi-layer film formed by depositing alternating layers of insulation and an electrode material on a substrate. The device also includes through-holes formed by etching the film to the substrate. The device also includes gate stacks formed by depositing barrier storage and a tunnel layers in sequence on inner walls of the through-holes. The device also includes hollow channels formed by depositing a channel material on the tunnel layer. The device also includes drains for bit-line connection in top portions of the hollow channels. The device also includes sources formed in contact regions between through-holes and the substrate in bottom portions of the hollow channels.

9 Claims, 8 Drawing Sheets

(51) Int. Cl.

| | |
|---|---|
| *H01L 21/28* | (2006.01) |
| *H01L 21/311* | (2006.01) |
| *H01L 29/04* | (2006.01) |
| *H01L 29/16* | (2006.01) |
| *H01L 29/161* | (2006.01) |
| *H01L 29/20* | (2006.01) |
| *H01L 29/201* | (2006.01) |
| *H01L 29/49* | (2006.01) |
| *H01L 29/51* | (2006.01) |

(52) U.S. Cl.
CPC ... *H01L21/02532* (2013.01); *H01L 21/02546* (2013.01); *H01L 21/02592* (2013.01); *H01L 21/02595* (2013.01); *H01L 21/28273* (2013.01); *H01L 21/28282* (2013.01); *H01L 21/31111* (2013.01); *H01L 21/764* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 29/04* (2013.01); *H01L 29/16* (2013.01); *H01L 29/161* (2013.01); *H01L 29/20* (2013.01); *H01L 29/201* (2013.01); *H01L 29/4916* (2013.01); *H01L 29/517* (2013.01); *H01L 29/518* (2013.01); *H01L 29/7883* (2013.01); *H01L 29/7889* (2013.01); *H01L 29/7926* (2013.01)

(56) References Cited

U.S. PATENT DOCUMENTS

| | | |
|---|---|---|
| 2009/0310425 A1 | 12/2009 | Sim et al. |
| 2010/0224928 A1 | 9/2010 | Fukuzumi et al. |
| 2012/0140562 A1* | 6/2012 | Choe .................. H01L 29/78 257/329 |
| 2012/0275220 A1* | 11/2012 | Liu .................. H01L 27/11582 365/185.03 |
| 2013/0313627 A1* | 11/2013 | Lee .................. H01L 21/76816 257/324 |

OTHER PUBLICATIONS

International Search Report and Written Opinion dated Aug. 23, 2013, issued in International Application No. PCT/CN2012/086511, with accompanying translation of Box V of the Written Opinion.

Jung, et al. "Three Dimensionally Stacked NAND Flash Memory Technology Using Stacking Single Crystal Si Layers on ILD and TANOS Structure for Beyond 30 nm Node." IEEE International Electron Devices Meeting, IEDM-2006, Dec. 11-13, 2006, pp. 1-4.

Tanaka, et al. "Bit Cost Scalable Technology with Punch and Plug Process for Ultra High Density Flash Memory." Symposium on VLSI Technology Digest of Technical Papers, 2007, pp. 14-15.

Jang, et al. "Vertical Cell Array using TCAT (Terabit Cell Array Transistor) Technology for Ultra High Density NAND Flash Memory." Symposium on VLSI Technology Digest of Technical Papers, 2009, pp. 192-193.

Lue, et al. "A Highly Scalable 8-Layer 3D Vertical-Gate (VG) TFT NAND Flash Using Junction-Free Buried Channel BE-SONOS Device." Symposium on VLSI Technology Digest of Technical Papers, 2010, pp. 131-132.

Nitayama, et al. "Bit Cost Scalable (BiCS) Technology for Future Ultra High Density Storage Memories." Symposium on VLSI Technology Digest of Technical Papers, 2013, pp. T60-T61.

\* cited by examiner

VERTICAL CHANNEL-TYPE 3D SEMICONDUCTOR MEMORY DEVICE AND METHOD FOR MANUFACTURING THE SAME

RELATED APPLICATIONS

This application claims priority to International Application No. PCT/CN2012/086511, filed on Dec. 13, 2012, entitled "VERTICAL CHANNEL-TYPE THREE-DIMENSIONAL SEMICONDUCTOR MEMORY DEVICE AND PREPARATION METHOD THEREFOR," which is incorporated herein by reference in its entirety.

BACKGROUND

1. Field

The disclosed technology relates to the technical filed of microelectronic devices and memories, and more particularly, to a non-volatile ultra-high-density vertical channel-type 3D semiconductor memory device and a method for manufacturing the same.

2. Description of the Related Technology

Demand for increased storage capacity to meet mass storage requirements drives advances in semiconductor memory technology. One approach is to decrease the size of NAND flash memory to enable increased data storage capability with high-density and low-cost non-volatile flash devices. However, as devices designed with conventional flash technology based on polysilicon floating gates, are scaled down in size using, for example, 20 nm process technology, crosstalk among cells may increase. In addition, extreme ultraviolet (EUV) lithography techniques costs for manufacturing may increase. Therefore, there is a need to develop new memory technology to meet mass storage requirements.

Three-dimensional (3D) memory structures differ from conventional methods for increasing storage density by decreasing the size of the memory cell, by stacking memory cells along a vertical direction (FIG. 1). Samsung Electronics of Korea presented a memory array with dual layers of planar channel obtained by an epitaxial process at the International Electron Devices Meeting (IEDM) in 2006. Toshiba of Japan reported a bit cost scalable (BiCS) memory array with vertical channels obtained by employing a "gate-first" process at VLSI, 2007. Samsung Electronics reported a terabit cell array transistor (TCAT) memory array with vertical channels and a Vertical Stacked Array Transistor memory structure obtained by employing a "gate-last" process at VLSI, 2009. Macronix of Taiwan reported a vertical gate VG-NAND 3D memory with multiple layers of planar channels at VLSI, 2010. International Technology Roadmap for Semiconductors (ITRS) 2001 pointed out that the 3D memory technique is becoming a mainstream technique of the development of flash devices.

Despite advances, issues including reliability of 3D memory devices remain. For example, a 3D memory based on vertical channels, like the memory cell in FIG. 2B, employs a poly silicon channel material regardless of whether a column-shaped channel is employed (FIG. 2A) or a vertical-strip-shaped channel is employed (FIG. 2C). Charge collapse caused by variation of the crystal size of the poly silicon channel and gap traps among crystal grains may significantly decrease carrier mobility. Typically, the carrier mobility of the polysilicon channel is about 1-50 $cm^2/vs$, which is much lower than that of the conventional monocrystal silicon. The excessive lower carrier mobility decreases a reading current of a memory string and limits an access capability of a peripheral circuit. Further, the memory cells stacked along the vertical direction cause different thicknesses of the polysilicon channel for the memory cells at upper and lower portions of the memory string due to a limitation of the etching process. Taking the structure shown in FIG. 3 as an example, the memory cells at the upper portion have a larger channel diameter than the memory cells at the lower portion (d1<d5). When the channel at the lower portion enters a completely depleted state, the channel at the upper portion is still in a partially depleted state. These variations in the storage capability impacts speed of writing and erasing, durability, and may decrease reliability.

SUMMARY OF CERTAIN INVENTIVE ASPECTS

The disclosed technology overcomes technical difficulties of 3D memory manufacturing technology, including deep hole etching and deposition of multiple dielectric layers, and forming polysilicon channels. The disclosed technology includes a vertical channel-type 3D semiconductor memory device and a method for manufacturing the same. The disclosed technology may solve the technical problems related to small channel current at an on-state caused by low carrier mobility in the polysilicon channels. The disclosed technology may improve consistency and reliability of the storage performance of vertical memory cells.

One aspect of the disclosed technology includes a vertical channel-type 3D semiconductor memory device. The device includes a substrate. The device includes a multi-layer film formed by alternatively depositing at least one insulating layer and at least one electrode material layer on the substrate. The device includes a plurality of through-holes that define respective channel regions. The through-holes are formed by etching the multi-layer film to the substrate. The device includes a plurality of gate stacks, each formed by depositing a barrier layer, a storage layer, and a tunnel layer in sequence on an inner wall of one of the plurality of through-holes. The device includes a plurality of hollow channels, each formed by depositing a channel material on a surface of the tunnel layer of one of the plurality of gate stacks. The device includes a plurality of drains, each formed in a contact hole region for bit-line connection in a top portion of one of the plurality of hollow channels. The device includes a plurality of sources, each formed in a contact region between a respective one of the plurality of through-holes and the substrate in a bottom portion of a respective one of the plurality of hollow channels.

Another aspect of the disclosed technology includes a method for manufacturing a vertical channel-type 3D semiconductor memory device. The method includes, depositing alternatively at least one insulating layer and at least one electrode material layer on a substrate to form a multi-layer film. The method includes etching the multi-layer film to the substrate to form a plurality of through-holes, each of which defines a respective channel region. The method includes depositing a barrier layer, a storage layer, and a tunnel layer in sequence on an inner wall of a respective one of the plurality of through-holes to form a plurality of gate stacks. The method includes depositing a channel material on a surface of the tunnel layer of a respective one of the plurality of gate stacks to form a plurality of hollow channels. The method includes forming a plurality of drains in respective contact hole regions for bit-line connection in respective top portions of the plurality of hollow channels. The method includes forming a plurality of sources in respective contact regions between the plurality of through-holes and the substrate in respective bottom portions of the plurality of hollow channels.

The disclosed technology may overcome the problem of small on-state channel current caused by low carrier mobility of a conventional polysilicon channel by decreasing channel stress during a crystallization process of the channel and reducing defect density at a back interface and within a bulk crystal lattice. The disclosed technology may enhance thickness control of the channel at the respective positions of the vertical directional memory string, so as to facilitate to enhance consistency and reliability of a storage performance for the respective vertical directional memory cells. The disclosed technology may provide a hollow channel which may be incompletely filled by controlling deposition time for the channel so as to decrease the difficulty in forming a conventional completely-filled channel. Moreover, it is also possible to decrease the requirement on etching angle of a deep hole so as to significantly decrease difficulty and cost for manufacturing the 3D memory.

DETAILED DESCRIPTION OF CERTAIN EMBODIMENTS

The disclosure will be further illustrated in detail in the following embodiments in conjunction with the accompanying drawings, so that the object, solution and advantages of the disclosed technology will become more apparent.

Figure 1:
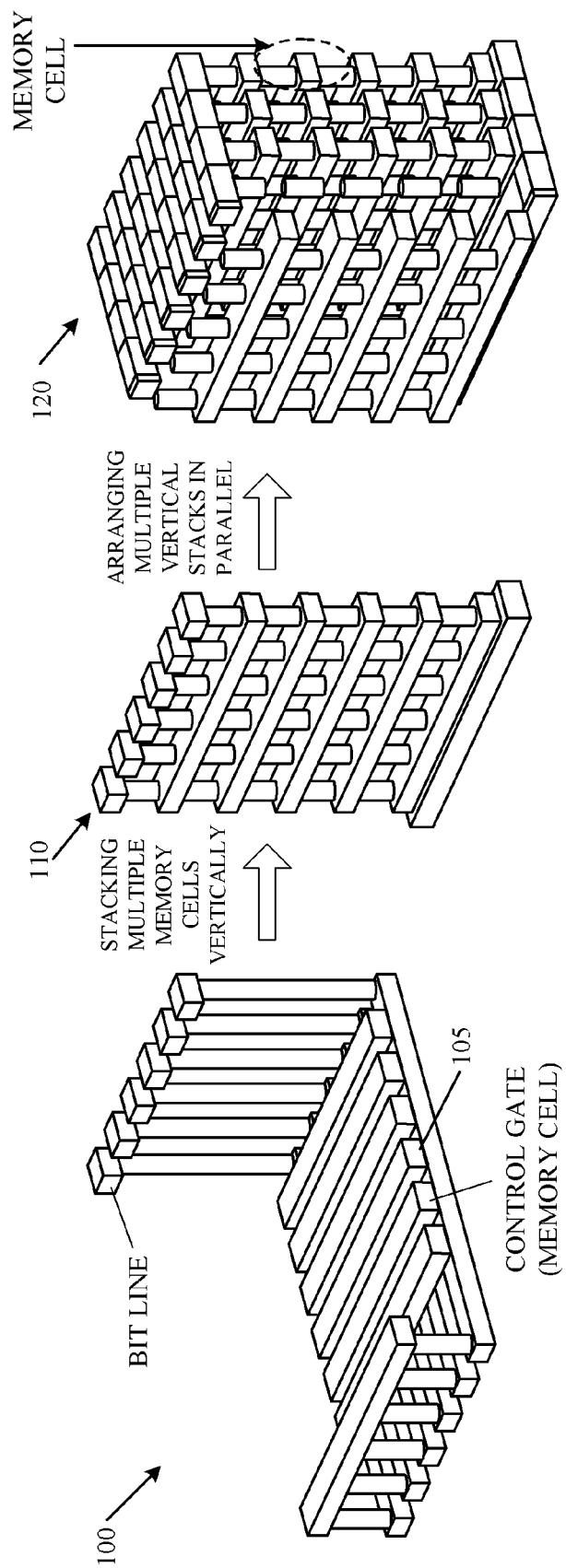
FIG. 1 is a schematic diagram showing an exemplary evolution from a conventional planar flash array to a 3D memory.

FIG. 1 is a schematic diagram showing evolution from a conventional planar flash array 100 to a 3D memory 120. Conventionally, a NAND-type flash device improves storage capacity by decreasing memory cell size so as to increase a number of the memory cells per cell area. Each memory string comprises two selection transistors and a plurality of memory cells. In order to increase the density, the 3D storage technique implements a vertical memory string 110 by vertically stacking a plurality of memory cells 105 and arranging these vertical memory strings 110 in parallel to form a high-density 3D memory 120.

Figure 2A:
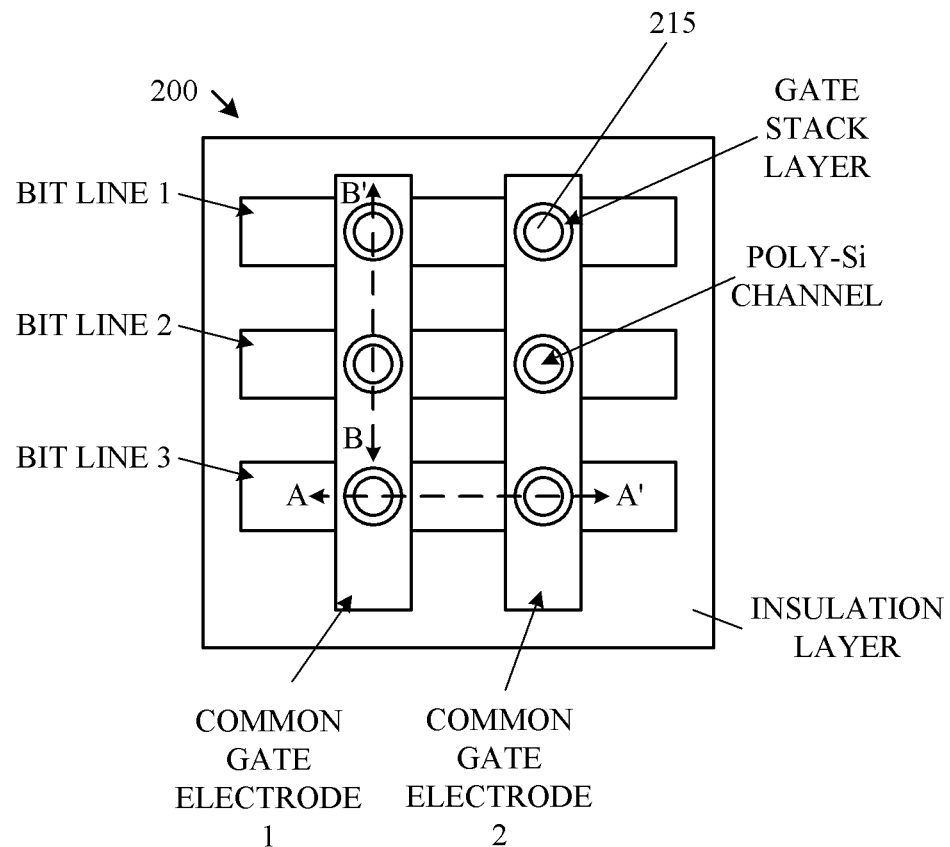
FIG. 2A is an exemplary top view illustration of a conventional vertical 3D memory with a column-shaped ring-gate structure.
Figure 2B:
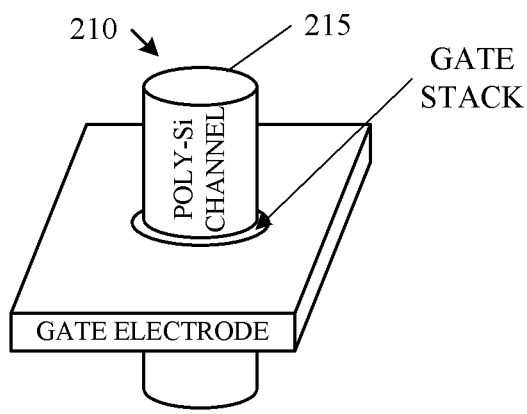
FIG. 2B shows an exemplary structure of a basic memory cell of FIG. 2A
Figure 2C:
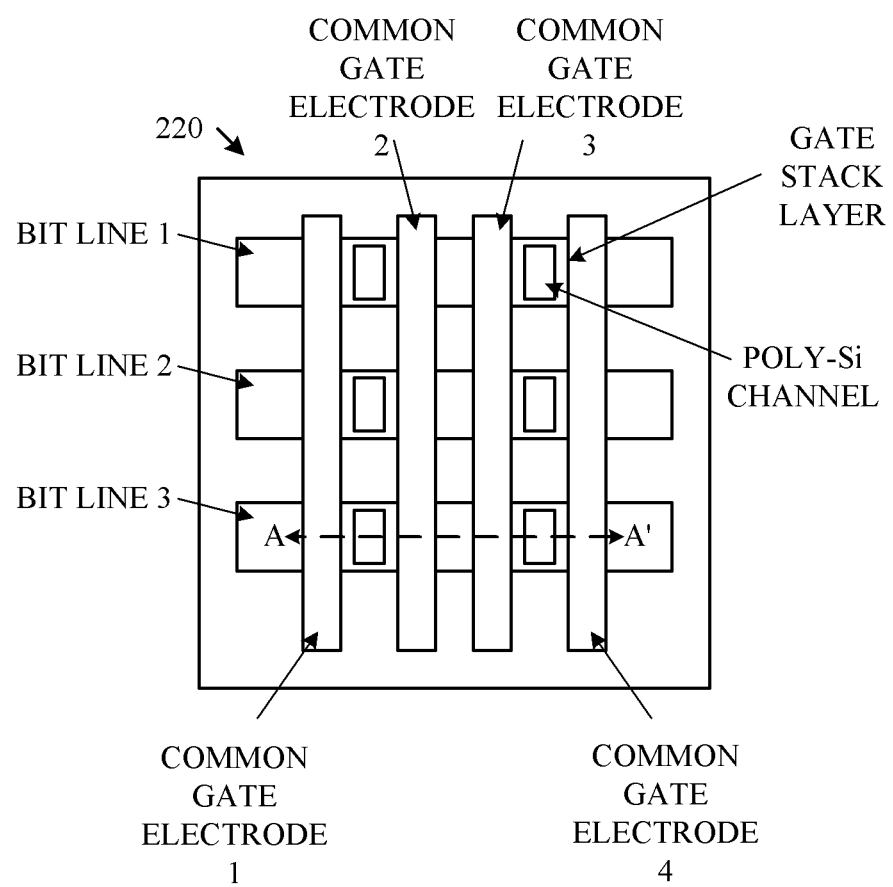
FIG. 2C is a top view of a 3D memory with a strip-shaped planar-gate structure.

FIG. 2A-FIG. 2C show a top view 200, a cross-sectional view 220 and a cell structural view 210 of a conventional vertical 3D memory 120. Vertical channel-type 3D memory may be manufactured using a high-density flash technique in which a polysilicon channel is formed by etching a deep hole or a deep groove followed by filling. The terabit cell array transistor (TCAT) structure proposed by Samsung and the bit cost scalable (BiCS) structure proposed by Toshiba both employ a column-shaped channel structure 215 as shown in FIG. 2A and FIG. 2B. Such a column-shaped channel 215 forms a vertical annular-gate electrode which is advantageous to control the speed of erasing and writing. From the perspective of improving integration density, the stripe-shaped vertical channel is similar to a dual gate structure which may implement multi-bit storage in each sheet-shaped channel by controlling the respective gate electrodes.

Figure 3:
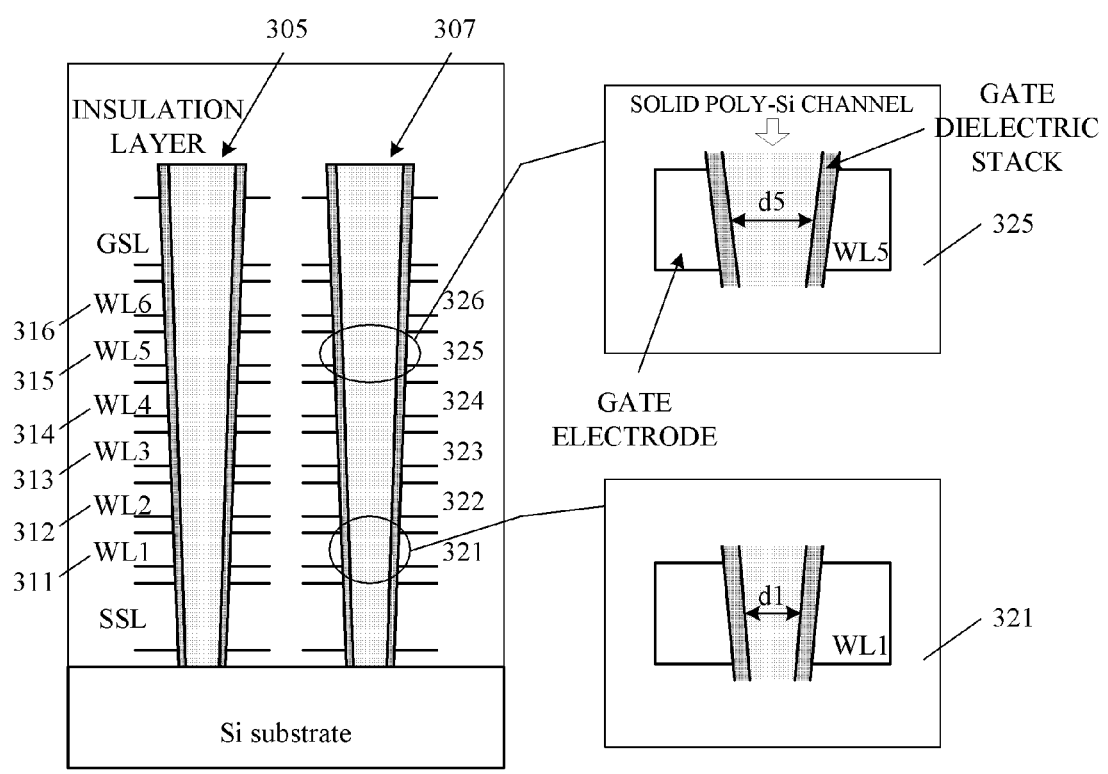
FIG. 3 is an schematic diagram illustrating an exemplary structure of a column-shaped memory array and the memory cells at different positions thereof along line A-A' of FIG. 2A and perpendicular to the paper plane, in which only the memory strings are shown while the peripheral connection wiring is omitted.

FIG. 3 shows a column-shaped memory array 305 and the memory cells 311, 312, 313, 314, 315, 315, 321, 322, 323, 324, and 325 at different positions along line A-A' of FIG. 2A and perpendicular to the paper plane. In FIG. 3, only the memory strings 305 and 307 are shown. The peripheral connection wiring is omitted. FIG. 3 shows that since it is difficult to obtain a deep hole with an etching angle of 90 degree by etching, an upper cell 325 in the vertical string has a larger channel diameter than that of a lower cell 321 during a subsequent process of forming a completely-filled polysilicon channel. Such a difference may lead to variation of the speed of erasing and writing, and different depletion states of the channel during reading and writing operations may lead to inconsistency of the cell's performance. Even more, a volume change during a process from amorphous silicon to polysilicon results in much more defects and larger stress due to the completely-filled structure, so as to decrease carrier mobility in the channel.

The disclosed technology may enhance consistency of the memory cells by obtaining uniform polysilicon channel thickness and increase the carrier mobility by decreasing scattering of carriers by back interface defects of the polysilicon channel. Thus, the disclosed technology proposes a hollow channel structure based on a concept of air-gap and applies it to a 3D memory.

Figure 4A:
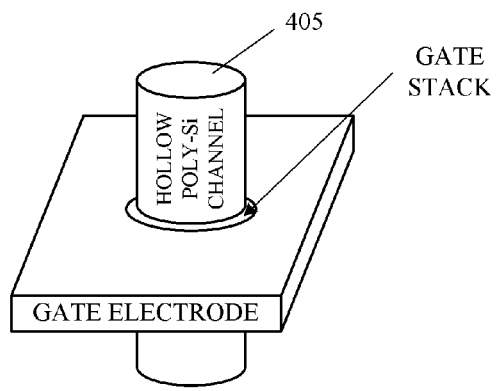
FIG. 4A is a schematic diagram of an exemplary structure of a memory cell with a hollow channel formed by employing an air-gap concept according to the disclosed technology.
Figure 4B:
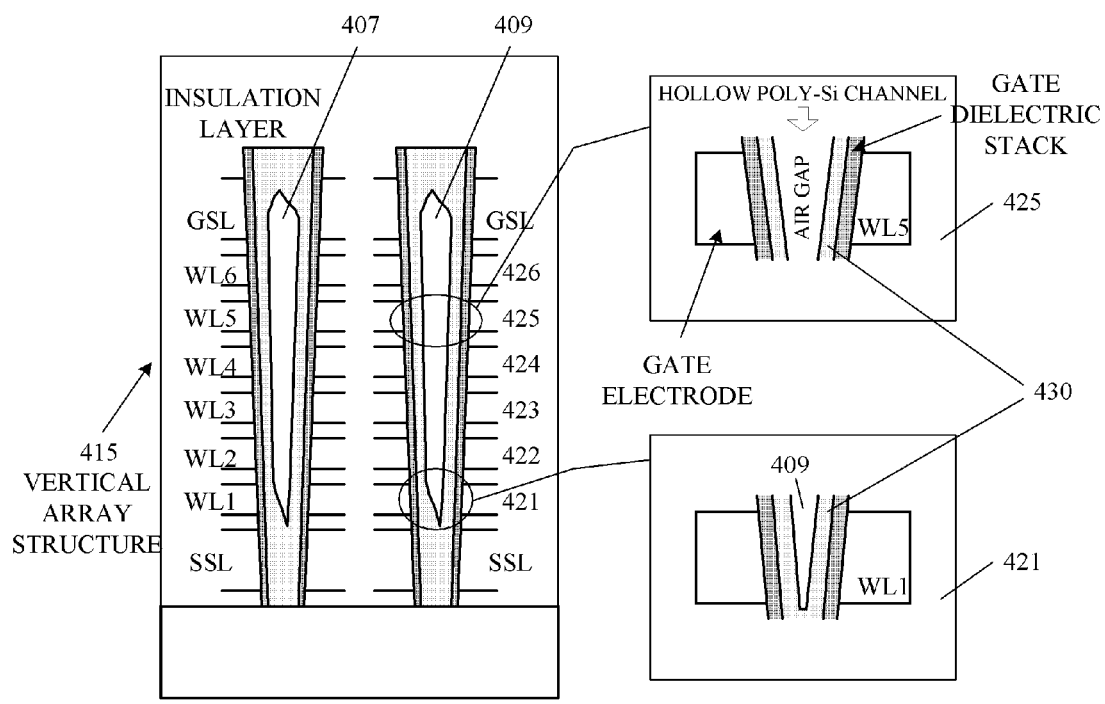
FIG. 4B is a schematic diagram of an exemplary 3D flash array comprising the memory cell shown in FIG. 4A according to the disclosed technology, in which the 3D flash array is shown along the line A-A' of FIG. 2A and perpendicular to the paper plane.

FIG. 4A shows a structure of a memory cell based on the concept of air-gap 405. FIG. 4B schematically shows a vertical array structure 415 of the 3D memory with the hollow structure 405. A hollow channel 407, 409 of the memory cell may be implemented automatically by controlling a deposition thickness during a channel deposition process. Incomplete filling of the channel 407, 409 may result in a polysilicon thin film 430 having a uniform thickness for all the memory cells 421, 422, 423, 424, 425, 426 in the vertical memory string 415 so that the memory cells 421, 422, 423, 424, 425, 426 of the 3D memory may be consistent. Meanwhile, such a polysilicon thin film reduces a number of bulk defects in gaps among crystal grains within the channel by reducing the thickness, so as to reduce fluctuations of threshold voltages of the memory cells. Moreover, a density of interface trap defects at a back interface of the polysilicon may be significantly reduce by processes such as post annealing, so as to decrease scattering of carriers and to increase carrier mobility in the channel. Further, for a process which employs amorphous silicon thin film deposition followed by annealing to form a polysilicon channel, the presence of the hollow structure 409 may effectively release stress generated by crystallization of amorphous silicon, and the change of channel stress may also enhance the mobility in the channel.

On the basis of the structure of the hollow-channel memory cell 405 employing the concept of air-gap and the 3D flash array with such memory cells 405 as shown in FIG. 4A and FIG. 4B, the disclosed technology includes a vertical channel-type 3D semiconductor memory device, comprising: a substrate 510; a multi-layer film formed by alternatively depositing at least one insulating layer 522 and at least one electrode material layer 526 on the substrate; a plurality of through-holes 530 which define respective channel regions, formed by etching the multi-layer film to the substrate 510; a plurality of gate stacks 580, each formed by depositing a barrier layer, a storage layer, and a tunnel layer in sequence on an inner wall of a respective one of the plurality of through-holes 530; a plurality of hollow channels 407, 409, each formed by depositing a channel material on a surface of the tunnel layer of a respective one of the plurality of gate stacks 580; a plurality of drains, each formed in a contact hole region 595 for bit-line connection in a top portion of a respective one of the plurality of hollow channels 407, 409; and a plurality of sources, each formed in a contact region 590 between a respective one of the plurality of through-holes 530 and the substrate 510 in a bottom portion of a respective one of the plurality of hollow channels 407, 409.

Each of the plurality of hollow channels 407, 409 may be any one selected from a group consisting of a hollow column-shaped channel, a hollow annular-shaped channel, and a hollow strip-shaped channel formed by introducing an air-gap. The channel material may comprise any one selected from a group consisting of: polysilicon, amorphous silicon, Ge—Si, Ge, GaAs, and InGaAs. Each of the plurality of hollow channels 407, 409 may be formed by depositing a polysilicon film directly on the surface of a respective one of the tunnel layers if the channel material comprises the polysilicon. Each of the plurality of hollow channels 409 may be formed by depositing an amorphous silicon film on the surface of a respective one of the tunnel layers followed by high-temperature annealing if the channel material comprises the amorphous silicon. Various surface processes may be applied on respective surfaces of the plurality of hollow channels 407, 409 to reduce defective states at the respective surfaces.

Each of the plurality of gate stacks 580 may be a charge capturing-type memory gate stack based on separate charge storage or a floating gate-type memory gate stack based on continuous storage medium. The charge capturing-type memory gate stack 580 may comprise a tunnel layer/separate dielectric storage layer/barrier layer structure. The separate dielectric storage layer may comprise SiN or a high-K dielectric material such as HfO. The floating gate-type memory gate stack may comprise a tunnel layer/storage layer/barrier layer structure. The storage layer may comprise polysilicon or metal, or a combination of polysilicon and metal.

It should be noted that the hollow-shaped cell and the array structure shown in FIG. 4A and FIG. 4B are merely examples of the disclosed technology. The disclosed technology is not limited to the string structure set forth in the embodiment in which each vertical memory string comprises two selection transistors (SSL and GSL) and six memory cells. For a NAND memory string 415 comprising a plurality of memory cells 421, 422, 423, 424, 425, 426 and the GSL and SSL transistors, an end closer to the GSL transistor is a bit-line connection terminal and another end closer to the SSL transistor is a ground terminal. On the basis of such an idea, it is possible to form any hollow-channel structure, such as a hollow-column shape, a hollow-annular shape, a hollow-strip shape and the like, by introducing the air gap. For a vertical memory string, the hollow portion may be in the memory cell region of the NAND memory string only. Alternatively, it may also comprise the selection transistor regions of the memory string or a portion of the channel region of the memory string. The hollow channel may be formed by depositing a thin film of polysilicon or by depositing amorphous silicon followed by high-temperature annealing. Meanwhile, the surface of the hollow portion may be subjected to various surface processes (e.g. annealing in nitrogen gas and the like) so as to reduce defective states, such as dangling bonds at the surface. The material of the vertical channel with the hollow structure is not limited to polysilicon. It may also be any one selected from a group consisting of amorphous silicon, GeSi, Ge, GaAs, InGaAs and the like.

Based on different hollow-channel structures, the vertical memory cell may employ any one selected from a group consisting of a vertical planar-gate structure, a vertical dual-gate structure, and a vertical annular-gate structure. Thus, source and drain regions (e.g. SL and BL contact regions of the NAND string) of the vertical NAND memory string comprising such vertical cells may be formed by a same type of doping (both are N type or P type doping) or different types of doping (e.g. the source region is formed by N type doping and the drain region is formed by P-type doping; and vice versa). Alternatively, the source and/or drain region may be formed of different materials (e.g. the contact region for the BL region may comprises metal silicide which is different from the channel material). Meanwhile, the gate stack of such memory cell may be a charge capturing-type memory gate stack based on separate charge storage or a floating gate-type memory gate stack based on continuous storage medium. The charge capturing-type memory gate stack may comprise a tunnel layer/separate dielectric storage layer (e.g., SiN layer)/barrier layer structure. The floating gate-type memory gate stack may comprise a tunnel layer/storage layer/barrier layer structure. The storage layer may comprise polysilicon or metal, or a combination of polysilicon and metal. The tunnel layer, the storage layer and the barrier layer of the gate stack may be all within a deep hole/groove formed by etching. Alternatively, these layers may not be within the deep hole/groove, and the deposition of the gate stack may be accomplished by the gate-last process prior to the deposition of a gate electrode and after formation of a polysilicon channel. Alternatively, these layers may be partially within the etched deep hole/groove. For example, the deposition of the gate stack may be accomplished by forming the tunnel layer prior to the deposition of polysilicon in the deep hole/groove and forming the storage layer and the barrier layer by the gate-last process prior to the deposition of the gate electrode.

Furthermore, the hollow-channel structure based on such a concept may be used for various vertical channel-type 3D flash devices employing the gate-last process (such as BiCS structure, a p-BiCS structure, or a SCP-NAND structure), and it may also be used for various vertical channel-type 3D flash devices employing the gate-first process (such as a TCAT structure).

Figure 6:
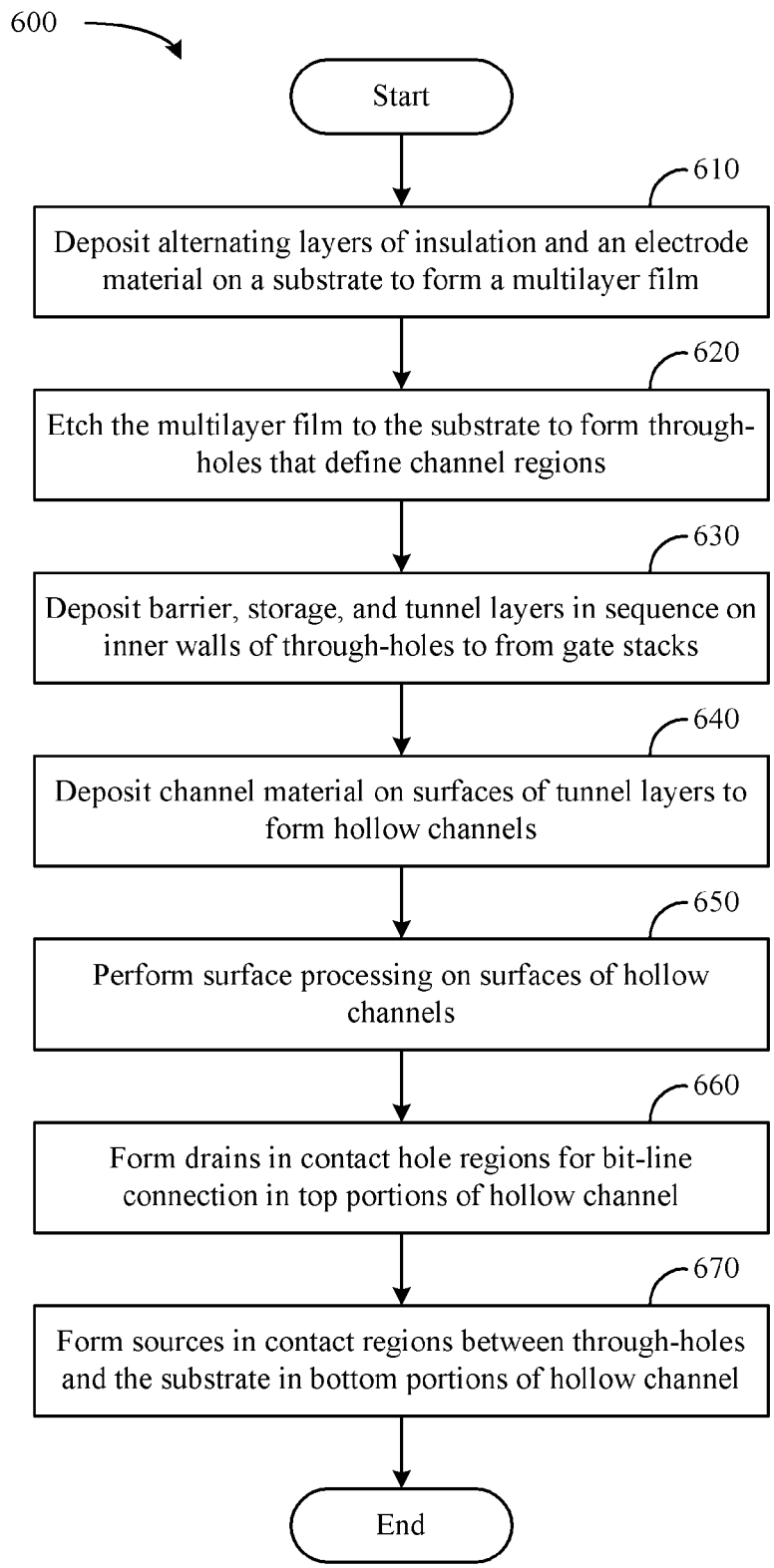
FIG. 6 is a flowchart illustrating a method for manufacturing a memory according to an embodiment of the disclosed technology.

FIG. 6 is a flowchart of a method 600 for manufacturing a vertical channel-type 3D semiconductor memory device. In block 610, method 600 deposits alternating layers of at least one insulating layer and at least one electrode material layers on a substrate to form a multilayer film. In block 620, method 600 etches the multi-layer film to the substrate to form a plurality of through-holes, each of which defines a respective channel region. In block 630, method 600 deposits a barrier layer, a storage layer, and a tunnel layer in sequence on an inner wall of a respective one of the plurality of through-holes to form a plurality of gate stacks. In block 640, method 600 deposits a channel material on a surface of the tunnel layer of a respective one of the plurality of gate stacks to form a plurality of hollow channels.

In block 650, method 600 performs surface processing on respective surfaces of the plurality of hollow channels to reduce defective states at the respective surfaces. The surface processing may comprise annealing in nitrogen gas so as to reduce dangling bonds at the respective surfaces of the plurality of hollow channels. In block 660, method 600 forms a plurality of drains in respective contact hole regions for bit-line connection in respective top portions of the plurality of hollow channels. In block 670, method 600 forms a plurality of sources in respective contact regions between the plurality of through-holes and the substrate in respective bottom portions of the plurality of hollow channels.

FIG. 5A-FIG. 5F illustrate steps of a flowchart of an exemplary process for manufacturing the memory illustrated in FIG. 4B with hollow channels along the line B-B' of FIG. 2A and perpendicular to the paper plane according to an embodiment of the disclosed technology. Other manufacturing processes may be employed to manufacture the 3D memory array. FIG. 5A-FIG. 5F illustrate an implementation of the hollow channel by a gate-first process as an example.

Figures 5A, 5B:
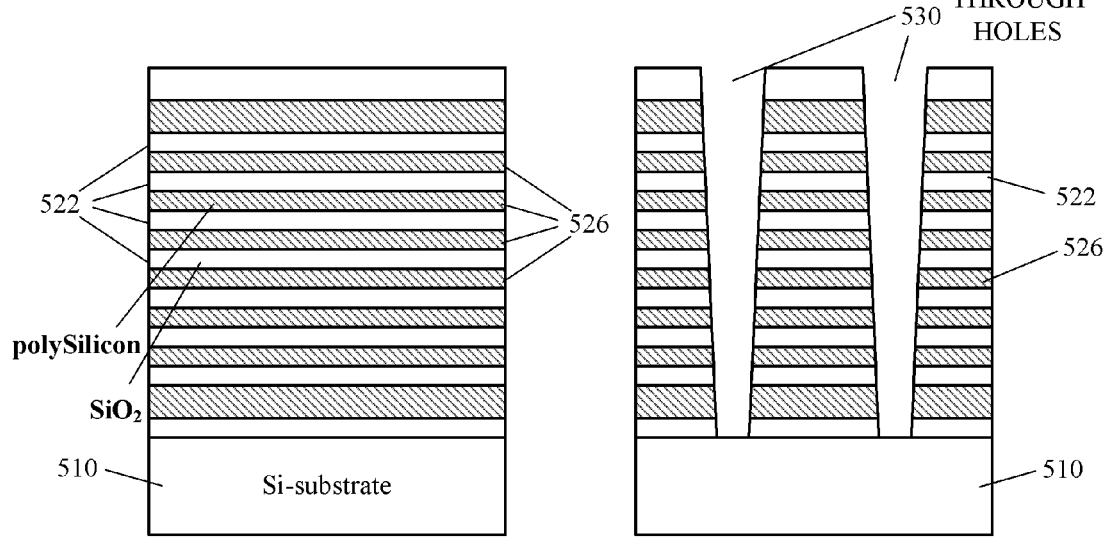
FIG. 5A-FIG. 5F illustrate steps of a flowchart of an exemplary process for manufacturing the memory illustrated in FIG. 4B with hollow channels along the line B-B' of FIG. 2A and perpendicular to the paper plane according to an embodiment of the disclosed technology.

FIG. 5A illustrates the exemplary step of depositing at least one insulating layer (e.g., $SiO_2$) and at least one electrode material layer (e.g., polysilicon) to form a multi-layer film, which includes at least one electrode for a vertical memory string. FIG. 5B illustrates the exemplary step of etching a plurality of through-holes to define a plurality of channel regions.

Figures 5C, 5D:
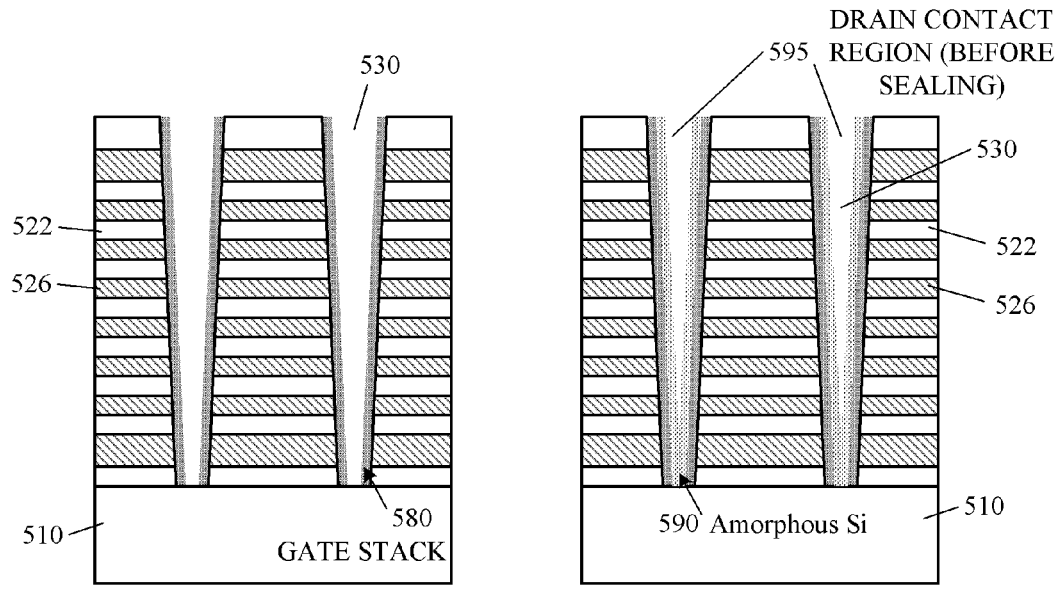

FIG. 5C illustrates the exemplary step of depositing a barrier layer, a storage layer, and a tunnel layer in sequence to obtain a gate stack for each memory cell, wherein the storage layer may be a continuous memory medium or a discrete dielectric.

Figure 5E:
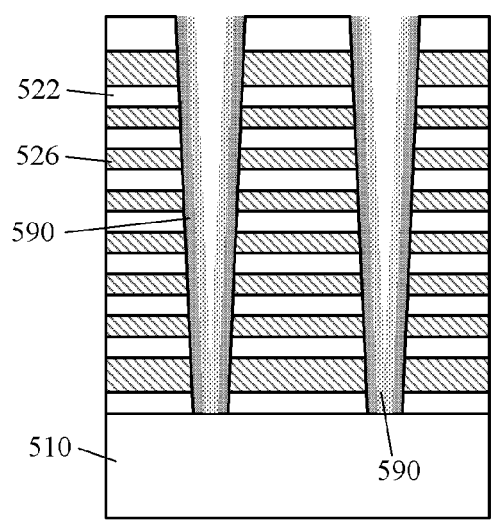
Figure 5F:
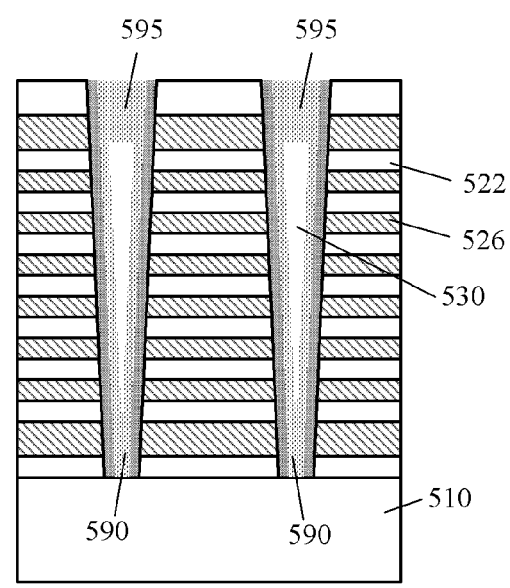

FIG. 5D illustrates the exemplary step of depositing an amorphous silicon film to form a plurality of hollow structures by completely filling;

FIG. 5E illustrates the exemplary step of forming a plurality of polysilicon channels by annealing and performing surface process on respective surfaces of the polysilicon channels to reduce defect states. FIG. 5F illustrates the exemplary step of sealing a drain contact region forming a drain junction for each hollow channel followed by back-end processes such as deposition of an insulating dielectric, connection of peripheral metal wiring, and the like.

By employing the above steps, a 3D memory array with vertical hollow channels may be effectively implemented. The polysilicon channels may also be implemented by omitting the steps shown in FIG. 5D and FIG. 5E while directly performing the incompletely filling of the thin polysilicon film to obtain a hollow polysilicon channel. There may be many variants of this concept and detailed description thereof is omitted for brevity.

As can be seen from above, since the hollow channel is employed, even if the etching angle of the deep hole is not vertical, a polysilicon channel with a uniform thickness may be obtained by controlling the deposition time of the thin film of the channel region, which may relax requirement of the etching process. In addition, such a structure may also relax requirement on quality of filling the completely-filled channel. Thus, the manufacturing process of the disclosed technology is relatively simple and the cost of manufacturing is reduced, which facilitates industrial application and promotion.

The example of FIG. 5A-FIG. 5F shows a vertical array structure with two selection transistors and six memory cells. The disclosed technology also covers stacks of more or fewer memory cells.

In a conventional vertical-channel 3D memory, a column-shaped polysilicon channel structure is formed by filling or epitaxial growth followed by annealing after defining a channel region by etching a deep hole. The disclosed technology introduces an air-gap to form a polysilicon channel with a hollow column-shape, a hollow annular-shape or a hollow strip-shape. The vertical-channel 3D memory device having the air-gap may effectively overcome the technical problem of a small channel current at an on-state caused by the low carrier mobility of the conventional polysilicon channel, by decreasing the channel stress during the crystallization process of the channel, improving the consistency of the thickness of the channel, and/or reducing the defect density at the back interface and within the bulk crystal lattice. This may improve the consistency and reliability of the respective memory cells along the vertical direction, and effectively decrease the difficulty and cost to manufacturing the vertical channel.

Furthermore, the concept of the hollow air-gap according to the disclosed technology is not limited to be applied to the polysilicon channel, it may also be applied to the formation of a vertical hollow electrode in a 3D crossing array of a resistive memory structure. For example, the hollow structure may be applied to a vertical electrode of a 3D vertical cross-bar-type resistive memory based on the concept of the resistive memory.

While the disclosure has been described with reference to specific embodiments about the object, technical solution and the technical effect of the disclosed technology, it should be understood that the description is illustrative of the disclosure and is not to be considered as limiting the disclosure. Various modifications, replacements and improvements may occur for those skilled in the art without departing from the true spirit and scope of the disclosure.

What is claimed:

1. A vertical channel-type 3D semiconductor memory device, comprising:
    a substrate;
    a multi-layer film formed by depositing alternating layers of at least one insulating layer and at least one electrode material layer on the substrate;
    a plurality of through-holes, which define respective channel regions, formed by etching the multi-layer film to the substrate;
    a plurality of gate stacks, each formed by depositing a barrier layer, a storage layer, and a tunnel layer in sequence on an inner wall of a respective one of the plurality of through-holes;
    a plurality of hollow channels, each formed by depositing and incompletely filling a channel material on a surface of the tunnel layer of a respective one of the plurality of gate stacks;

a plurality of drains, each formed in a contact hole region for bit-line connection in a top portion of a respective one of the plurality of hollow channels; and a plurality of sources, each formed in a contact region between a respective one of the plurality of through-holes and the substrate in a bottom portion of a respective one of the plurality of hollow channels.

2. The device of claim 1, wherein each of the plurality of hollow channels has a column, annular, or strip shape, and/or wherein the channel material is selected from the group consisting of polysilicon, amorphous silicon, Ge—Si, Ge, GaAs, and InGaAs.

3. The device of claim 2; wherein each of the plurality of hollow channels is formed by depositing a polysilicon film directly on the surface of a respective one of the tunnel layers.

4. The device of claim 2, wherein each of the plurality of hollow channels is formed by depositing an amorphous silicon film on the surface of a respective one of the respective tunnel layers followed by high-temperature annealing.

5. The device of claim 1, wherein each of the plurality of gate stacks is a charge capturing-type memory gate stack based on separate charge storage or a floating gate-type memory gate stack based on a continuous storage medium.

6. The device of claim 5, wherein the charge capturing-type memory gate stack comprises:

a tunnel layer;

a separate dielectric storage layer; and a barrier layer.

7. The device of claim 6, wherein the separate dielectric storage layer comprises SiN or a high-K dielectric material of HfO.

8. The device of claim 5, wherein the floating gate-type memory gate stack comprises:

a tunnel layer;

a storage layer; and a barrier layer.

9. The device of claim 8, wherein the storage layer comprises polysilicon, metal, or a combination of polysilicon and metal.

* * * * *